United States Patent
Lai et al.

(10) Patent No.: US 11,088,273 B2
(45) Date of Patent: Aug. 10, 2021

(54) SEMICONDUCTOR DEVICE WITH INTEGRATED CLAMP DIODE

(71) Applicant: NEXPERIA B.V., Nijmegen (NL)

(72) Inventors: Yan Lai, Nijmegen (NL); Mark Gajda, Nijmegen (NL); Barry Wynne, Nijmegen (NL); Phil Rutter, Nijmegen (NL)

(73) Assignee: NEXPERIA B.V., Nijmegen (NL)

(*) Notice: Subject to any disclaimer, the term of this patent is extended or adjusted under 35 U.S.C. 154(b) by 5 days.

(21) Appl. No.: 16/704,796

(22) Filed: Dec. 5, 2019

(65) Prior Publication Data
US 2020/0227548 A1 Jul. 16, 2020

(30) Foreign Application Priority Data
Dec. 6, 2018 (EP) .................... 18210693

(51) Int. Cl.
*H01L 29/78* (2006.01)
*H01L 29/06* (2006.01)
*H01L 29/49* (2006.01)
*H01L 27/02* (2006.01)

(52) U.S. Cl.
CPC ...... *H01L 29/7811* (2013.01); *H01L 27/0255* (2013.01); *H01L 29/0646* (2013.01); *H01L 29/49* (2013.01); *H01L 29/7808* (2013.01); *H01L 29/7813* (2013.01)

(58) Field of Classification Search
CPC .......... H01L 27/0255; H01L 29/7808
See application file for complete search history.

(56) References Cited

U.S. PATENT DOCUMENTS

| 6,140,678 A * | 10/2000 | Grabowski | H01L 27/0255 |
| | | | 257/328 |
| 2007/0228518 A1 | 10/2007 | Yilmaz et al. | |
| 2019/0103484 A1 * | 4/2019 | Saxena | H01L 29/7803 |

FOREIGN PATENT DOCUMENTS

EP  3264463 A1  1/2018

OTHER PUBLICATIONS

European Search Report and Written Opinion for corresponding application EP18210693.0, dated Jun. 12, 2019, 7 pages.

* cited by examiner

*Primary Examiner* — Farun Lu
(74) *Attorney, Agent, or Firm* — Ohlandt, Greeley, Ruggiero & Perle, LLP (57) ABSTRACT

The present disclosure relates to a semiconductor device, and associated method of manufacture. The semiconductor device includes, MOSFET integrated with a p-n junction, the p-n junction arranged as a clamping diode across a source contact and a drain contact of the MOSFET. The MOSFET defines a first breakdown voltage and the clamping diode defines a second breakdown voltage, with the first breakdown voltage being greater than the second breakdown voltage so that the clamp diode is configured and arranged to receive a low avalanche current and the MOSFET is configured and arranged to receive a high avalanche current.

15 Claims, 7 Drawing Sheets

SEMICONDUCTOR DEVICE WITH INTEGRATED CLAMP DIODE

CROSS REFERENCE TO RELATED APPLICATIONS

This application claims the benefit under 35 U.S.C. § 119(a) of European Application No. 18210693.0 filed Dec. 6, 2018 the contents of which are incorporated by reference herein in their entirety.

BACKGROUND OF THE DISCLOSURE

1. Field of the Disclosure

The present disclosure relates to a semiconductor device. More particularly the present disclosure relates to a MOSFET semiconductor device with an integrated clamp diode.

2. Description of the Related Art

MOSFET semiconductor devices may be used as switching devices. When in use such devices may undergo a number of switching events per second. A switching event is when the device turns on and then turns off. When a MOSFET is turned off uncontrolled overshoots and voltage spikes may be observed on the drain of the device due to current changes over time and inductances in the device. As the number of switching events per second increases the voltage spikes observed on the drain can exceed the specification of the application, where a typical application would be where the magnitude of the voltage spike should not exceed 80-90% of voltage rating of the device, and/or exceed the breakdown voltage of the MOSFET.

The breakdown voltage BVdss of a MOSFET device is the voltage at which the reverse biased body diode breaks down and a significant avalanche current starts to flow between the source and drain of the device. In the case of multiple repetitive switching events, the MOSFET may undergo repetitive avalanche events which may in turn cause device parameters, such as: device on resistance Rds(on); threshold voltage Vth; and drain-source leakage current Idss, to vary as a result of hot majority carrier injection into the active area of the MOSFET during such avalanche events. The variation in device parameters may result in reduced device functionality and/or reliability. In addition, repetitive hot majority carrier injection may eventually cause the MOSFET to fail. Therefore, preventing the active area of the MOSFET from avalanching or reducing the time the active area undergoes avalanche will prevent device parameters from changing or prevent failure of the MOSFET.

It is known to use so-called clamp diodes to prevent avalanche. As discussed in EP1761953 a Zener diode is used to clamp a drain-source voltage lower than the field plate induced breakdown voltage. Generally, such a clamp diode, connected between the drain and source of MOSFET may prevent the active area of the MOSFET from avalanching or reduce the time that the active area undergoes an avalanche event. However, this has a disadvantage of requiring a higher active area breakdown voltage which in-turn increases the Rds(on) of the device.

Other known arrangements rely on the use of parallel clamp diodes, but such arrangements are configured to operate for single event, high current, high avalanche pulses only, rather than single event, high current, high avalanche and also repetitive avalanche pulses.

SUMMARY

Various example embodiments are directed to issues such as those addressed above and/or others which may become apparent from the following disclosure concerning the operation of the MOSFET semiconductor device. In certain example embodiments, aspects of the present disclosure involve the use of a MOSFET semiconductor device structure that provides enhanced avalanche breakdown control and in particular enhanced avalanche breakdown control during repetitive avalanche pulses.

According to an embodiment there is provided a semiconductor device, comprising: a MOSFET integrated with a p-n junction, the p-n junction arranged as a clamping diode across a source contact and a drain contact of the MOSFET; wherein the MOSFET defines a first breakdown voltage and the clamping diode defines a second breakdown voltage, wherein the first breakdown voltage is greater than the second breakdown voltage such that the clamp diode is configured and arranged receive lower avalanche current and the MOSFET is configured and arranged to receive higher avalanche current.

The MOSFET may comprise a semiconductor substrate; an epitaxial layer formed on the semiconductor substrate; and a body layer formed on the epitaxial layer; a plurality of spaced apart deep conductive trenches extending through the body layer and the epitaxial layer and extending into the semiconductor substrate; wherein the semiconductor substrate and the epitaxial layer are formed of a first conductivity type; and the body layer is formed of a second conductivity type opposite to the first conductivity type.

The spaced apart deep conductive trenches define a contact window of the body layer, wherein the contact window is connected to at least one shallow conductive trench forming a first contact terminal of the p-n junction. The p-n junction provides a clamping resistance across the source and drain of the MOSFET region.

The clamping resistance may be modified by modifying the resistance of the at least one shallow conductive trench. Furthermore, the clamping resistance can be modified by including a plurality of shallow conductive trenches. The clamping resistance may be modified by varying the density per unit area of the plurality of shallow conductive trenches. The clamping diode is arranged to avalanche before the MOSFET.

The total area of the shallow conductive trenches may comprise between 0.1% and 99.9% of the contact window area. Preferably, the total area of the shallow conductive trenches may comprise between 1% and 10%, and ideally this may comprise between 0.1% and 1%. The clamping resistance may be modified by modifying the total area of the contact window.

According to a further embodiment there is also provided a method of manufacturing a semiconductor device, comprising: forming a MOSFET integrated with a p-n junction, the p-n junction arranged as a clamping diode across a source contact and a drain contact of the MOSFET; wherein the MOSFET active region defines a first breakdown voltage and the clamping diode defines a second breakdown voltage, wherein the second breakdown voltage is lower than the first breakdown voltage such that the clamp diode is configured and arranged receive lower avalanche current and the MOSFET is configured and arranged to receive higher avalanche current.

The method may further comprise defining a contact window of the body layer between the spaced apart deep conductive trenches; and connecting the contact window to at least one shallow conductive trench to form a first contact terminal of the p-n junction.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
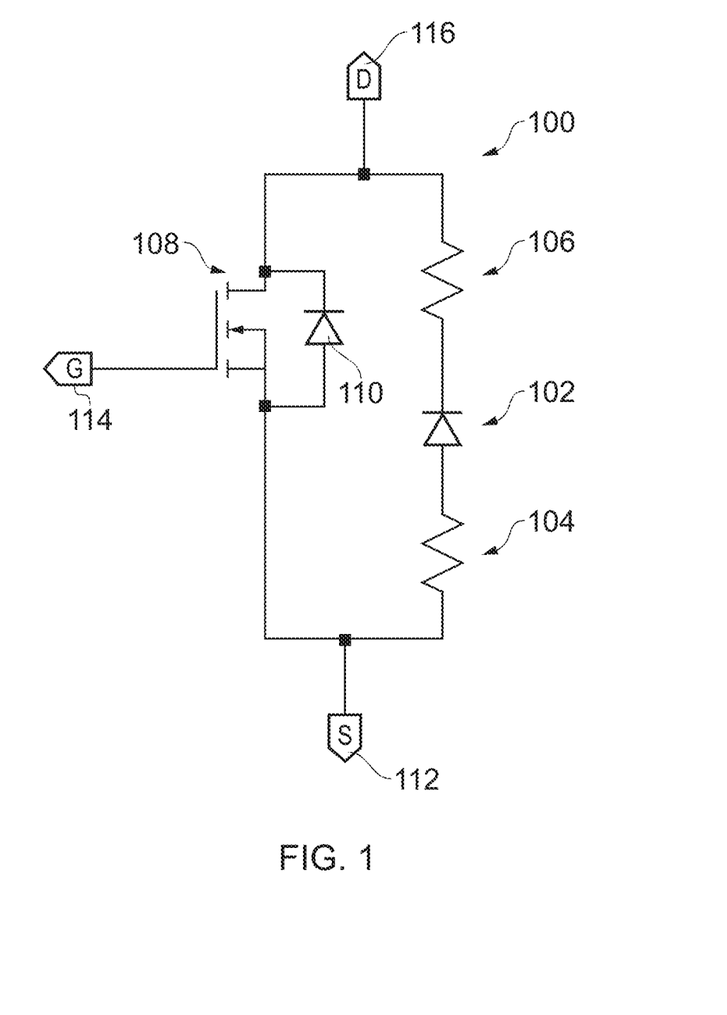
FIG. 1 illustrates an equivalent circuit diagram of a MOSFET semiconductor device in accordance with an embodiment the present disclosure.

With reference to FIG. 1, an equivalent circuit diagram of a MOSFET semiconductor device 100 according to embodiments is illustrated. The MOSFET semiconductor device 100 comprises source 112, gate 114 and drain 116 contacts connected to a MOSFET active area 108, and a clamp circuit. The clamp circuit comprises a clamping diode 102, having an anode and a cathode, in series with a clamping resistance 104 arranged in parallel across the source 112 and drain 116 contacts. In addition to the clamping resistance 104, the clamping diode 102 includes drift resistance 106 associated with an inherent body diode 110 of the active area 108 across the source 112 and drain 116 contacts. The clamping resistance 104 is due to the resistance of the contact made with the body diode, as discussed in more detail below with reference to FIG. 2. In embodiments, the clamping resistance 104 is provided in addition to the drift resistance 106.

Figure 2:
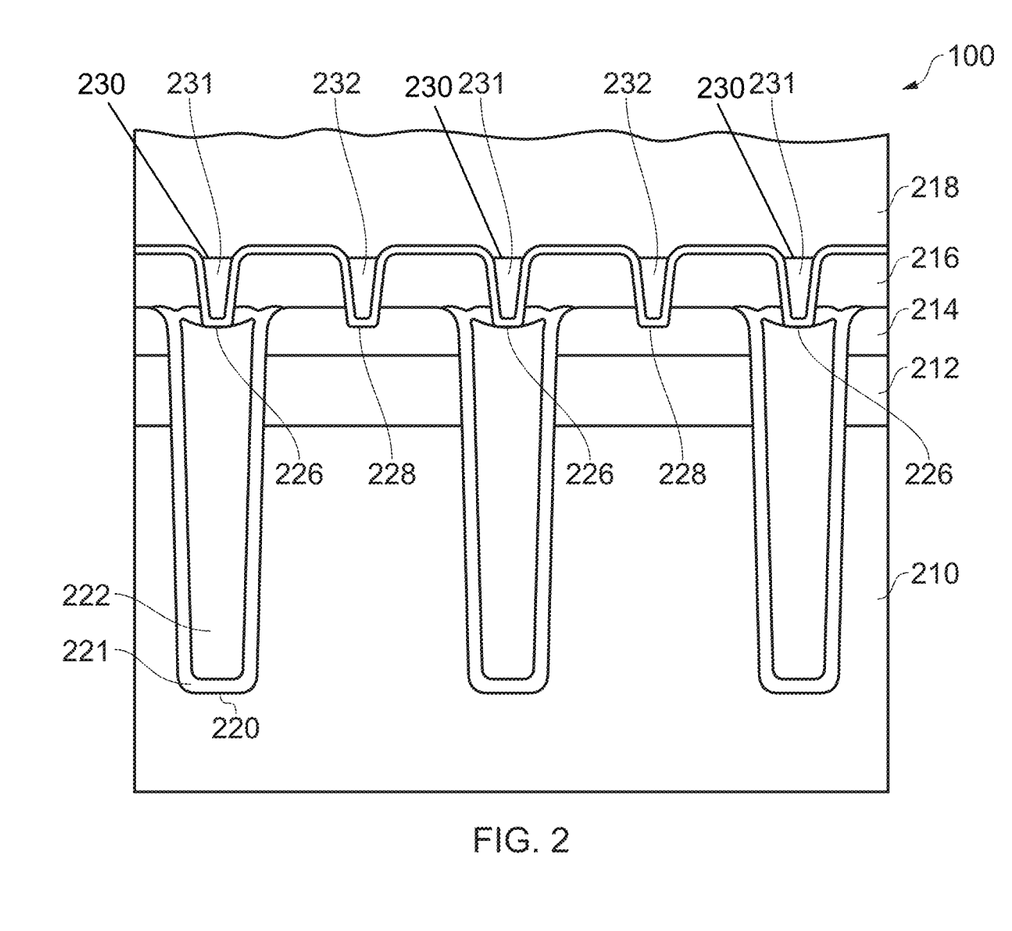
FIG. 2 illustrates a cross sectional view of a MOSFET semiconductor device in accordance with an embodiment the present disclosure.

FIG. 2 shows a cross-sectional view of the MOSFET semiconductor device 100 according to embodiments. The MOSFET semiconductor device 100 may comprise a substrate 210, an epitaxial layer 212 (such as a silicon epitaxial layer) formed on the substrate, which may form a drift region. A body layer 214 may be formed on the epitaxial silicon layer 212. An insulating layer 216 may be formed on the body layer 214 and a conductive layer 218 may be formed on the insulating layer 216. The conductive layer 218 may form the source contact of the MOSFET semiconductor device 100. The substrate 210 may be a doped substrate.

The following discussion of FIG. 2 is in the context of an n-channel MOSFET semiconductor device 100, and in this regard, the substrate 210 and the epitaxial silicon layer 212 are each formed as n-type layers and the body layer 214 is formed as a p-type layer. The body layer 214 may be formed by way of an appropriate implant into the epitaxial silicon layer 212.

As illustrated in FIG. 2, deep trenches 220 extend from between portions of the body layer 214 into, and terminate in, the doped substrate 210. Alternatively (not illustrated), the deep trenches 220 may extend into and terminate in the epitaxial silicon layer 212. The deep trenches 220 may be lined with an insulating material 221 and then filled with conductive material 222. A first set of shallow source trenches 226 extend through the insulating layer 216 to the conductive material 222 of the deep trenches 220. The shallow source trenches 226 are filled with a conductive material 231 to form source contacts 230. The conductive material 231 of the source contacts 230 couple the conductive layer 218 to the conductive material 222 of the deep trenches 220. A second set of shallow trenches 228 extend through the insulating layer 216 and terminate in the body layer 214. Each of the second set of shallow trenches 228 are arranged in contact windows (illustrated in more detail in FIG. 3) between the each of the deep trenches 220 and are filled with a conductive material 232 to couple the conductive layer 218 to the body layer 214.

The first set of shallow source trenches 226 and the second set of shallow source trenches 228 may be formed simultaneously. Alternatively, they may be formed during separate processes. Likewise, the conductive materials 231, 232 are formed from the same material and, furthermore the conductive materials 231, 232 may be formed simultaneously to the formation of the conductive layer 218. In this way the conductive materials 231, 232 and the conductive layer 218 may be formed from the same material.

The arrangement of the second set of shallow trenches 228 forms the clamping diode 102 illustrated in FIG. 1. The conductive materials 230 and 232 may be the same material and advantageously may be formed in the same process step.

In the context of an n-channel MOSFET semiconductor device 100, the anode of the clamping diode 102 is formed using the second set of shallow source trenches 228 by coupling the conductive material 232 to the p-type body layer 214. The cathode of the clamping diode 102 is formed by the substrate 210 and the epitaxial silicon layer 212 with an appropriate drain contact (not illustrated) formed on the substrate 210. Therefore, a p-n junction of the clamping diode 102 is formed by the p-type body layer 214 and the substrate 210 and the epitaxial silicon layer 212 forming a drift region. In this regard the anode of the clamping diode 102 is connected to the source 112 by the electrical connection of the conductive layer 218 to the conductive material 232 of the second set of shallow trenches 228. Likewise, the cathode of the clamping diode 102 is connected to the drain 116 such that the clamping diode is connected in parallel across the source 112 and drain 116 as mentioned above. In this way, the clamping diode 102 and series drift resistance 106 is integrated on the die of the MOSFET semiconductor device 100, that is a vertical portion of the diode in the epitaxial silicon layer 212 (the drift region) and substrate 210.

As mentioned above, the clamping diode 102 has an inherent series resistance which may be made up of the combination of the resistances of the contact, formed by conductive layer 218, the conductive material 232 coupling the conductive layer to the anode of the clamping diode 102 and the drain contact (not illustrated) formed on the substrate 210, and the intrinsic resistance of the diode material, namely the vertical portion of the body layer 214 under the conductive material 232, epitaxial silicon layer 212 and the substrate 210 forming the p-n junction of the clamping diode 102. For the purposes of this discussion, the clamping resistance 104 is the spreading resistance of the body layer 214 between each conductive materials 232, whilst the combined resistance of the conductive layer 218 the drain contact and the inherent resistance of the diode material may be considered to be the inherent series drift resistance 106.

Assuming that the resistance of the conductive layer 218, the drain contact and the intrinsic resistance of the diode material remain fixed, it is possible to vary the resistance of the conductive material 232, and thus the clamping resistance 104, as will be discussed in more detail below with reference to FIG. 2 and FIG. 3.

Figure 3:
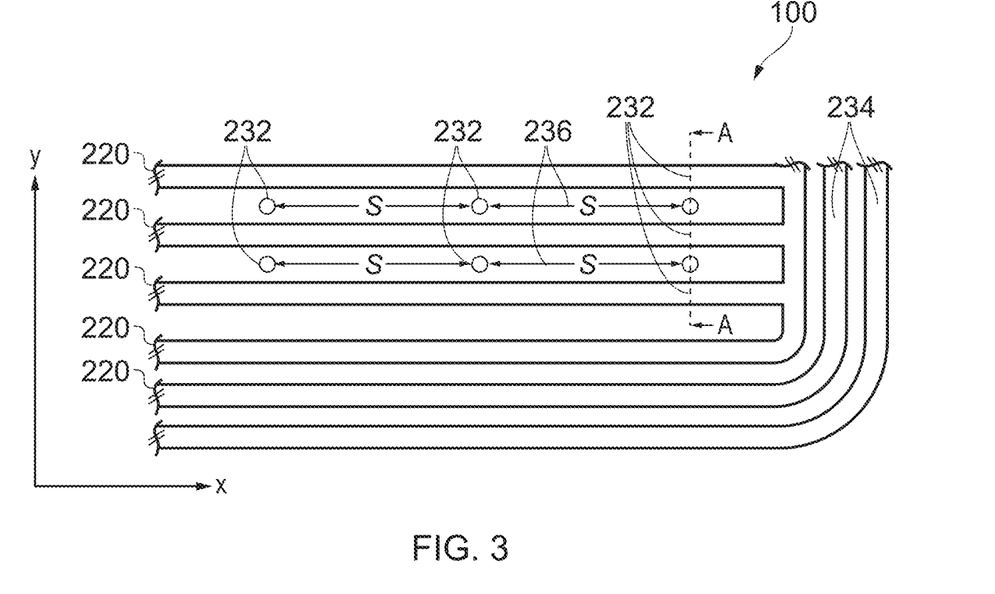
FIG. 3 illustrates a top view of a MOSFET semiconductor device, in accordance with an embodiment of the present disclosure.

Referring now to FIG. 3, a top view of the structure of the MOSFET semiconductor device 100 according to embodiments is illustrated. For ease of explanation, the conductive layer 218, as illustrated in FIG. 2, is omitted from FIG. 3 to show the underlying conductive material 231, 232 and respective trench 226, 228 structure. FIG. 2 is a cross section of FIG. 3 through line A-A. Consistent with FIG. 2, the MOSFET semiconductor device 100 includes a network of interconnected deep trenches 220 extending between portions of the body layer 214 into the doped substrate 210. The deep trenches 220 may be lined with an insulating material 221 and then filled with conductive material 222 and the conductive material of the deep trenches is contacted to the first set of shallow source trenches 226 filled with a conductive material, thus forming the source contacts 230. The second set of shallow trenches 228 are arranged in the contact windows 236 between the each of the deep trenches 220 and are filled with a conductive material 232 to form the anode contact of the clamping diode 102 to the underlying body layer 214. Each contact window 236, also known as the diode region, may contain multiple, spaced apart, anode contacts of the clamping diode 102.

An appropriate edge termination structure may be provided around the periphery of the MOSFET semiconductor device 100 as understood by the skilled person. The skilled person will also appreciate that the edge termination structure may be formed by any appropriate structure such as an edge trench or combination of edge trenches 234 as illustrated.

As mentioned above, it is possible to modify the resistance of the conductive material 232, and thus the clamping resistance 104 by modifying the number of contacts 232 provided in the contact windows 236, and/or varying the size of the individual contacts 232. In this regard the clamping resistance 104 may be modified by varying the total area of the contacts 232. As discussed below, varying the size of the individual contacts would change the contact resistance of each individual contact 232 but not the overall resistance of the MOSFET semiconductor device 100. Modifying the resistance of the conductive material 232 in this way modifies the spreading resistance of the clamping diode 102. Specifically, increasing the number of contacts per unit area, or in other words decreasing the spacing between the contacts 232, decreases the spreading resistance of the clamping diode 102. Conversely, decreasing the number of contacts per unit area, or in other words, increasing the spacing between the contacts, increases the spreading resistance of the clamping diode 102. Alternatively, modifying the resistivity of the material in the body layer 214 between the contact 232 will also modify the resistance.

According to an embodiment, the total area of the contacts is the product of the number of contacts and the area of one of the contacts (assuming that the contact area is the same for each contact). Assuming the area of each of the contacts is the same, the total resistance of the contacts giving rise to the clamping resistance 104 may be modified by changing the horizontal spacing (indicated by the horizontal direction X in FIG. 3) between the contacts 232. For a fixed MOSFET semiconductor device 100 diode region area, that is the area of the contact windows 236, the resistance may be increased by reducing the number of contacts, that is increasing the spacing, S, between contacts. Conversely, the resistance may be reduced by increasing the number of contacts, that is reducing the spacing, S, between the contacts. Likewise, for a fixed number of contacts the total area of the contacts may be increased or reduced by respectively increasing or decreasing the area of each of the individual contacts.

As mentioned above, the MOSFET devices may undergo repetitive avalanche events which may in turn cause device parameters, such as: device on resistance Rds(on), threshold voltage Vth, and drain-source leakage current Idss, and breakdown voltage to vary as a result of hot majority carrier injection into the MOSFET active area 108 during such avalanche events. When the MOSFET semiconductor device 100 is in reverse bias, that is by application of a reverse bias drain-source voltage, VDS, (or in other terms, a reverse drain source current IDS) and VDS is increased to the breakdown voltage of the clamping diode 102, the clamping diode 102 will begin to avalanche and the MOSFET active area 108 will be clamped to the breakdown voltage of the clamping diode 102, where the breakdown voltage of the clamping diode 102 is rated lower than the breakdown voltage of the MOSFET active area 108. As the reverse drain-source voltage is increased past the breakdown voltage of the clamping diode 102 and towards the breakdown voltage of the MOSFET active area 108, the MOSFET active area 108 starts to share the reverse drain source current IDS with the clamping diode 102 such that the breakdown voltage of the MOSFET semiconductor device 100 will be the breakdown voltage of the MOSFET active area 108, which is rated higher than the breakdown voltage of the clamping diode 102. This behaviour is illustrated in the graph of FIG. 4, where the vertical axis is the applied reverse drain source current IDS, and the horizontal axis is the corresponding reverse drain source voltage VDS.

Figure 4:
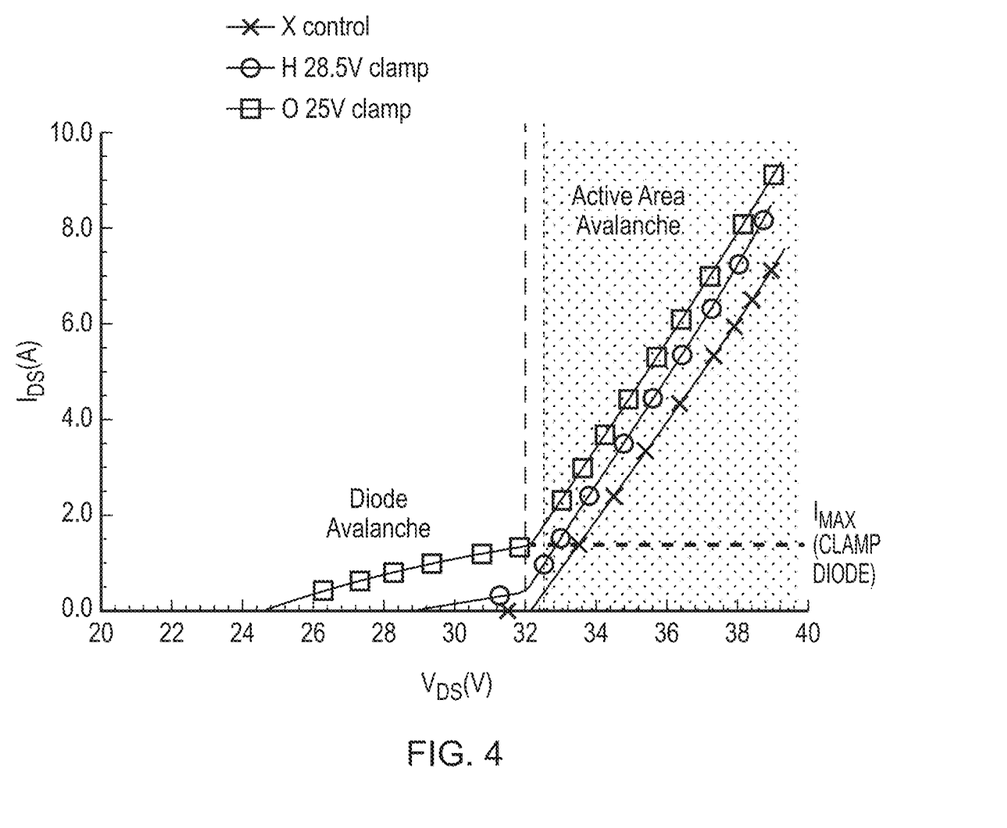
FIG. 4 illustrates the reverse IDS current versus reverse VDS voltage behavior for various MOSFET semiconductor devices with clamping diode having various breakdown voltages.

With reference to plot "X control" of FIG. 4, this is presented for comparison purposes only and shows the situation where there is no clamping diode 102 as described above. As illustrated the breakdown voltage is therefore 32 volts, that is the breakdown voltage of the MOSFET active area, and during operation therefore there can be no clamp diode avalanche as seen from the horizontal nature of plot "X control" up to the 32-volt breakdown voltage of the MOSFET active area.

With reference to plot "O 25V clamp" of FIG. 4, this shows the behaviour of the MOSFET semiconductor device 100 according to embodiments for a clamping diode 102 having a breakdown voltage of 25V. Similarly, plot "H 28.5V clamp" of FIG. 4 shows the behaviour of a MOSFET semiconductor device 100 according to embodiments for a clamping diode 102 having a breakdown voltage of 28.5V. In the case of both "O 25V clamp" and "H 28.5V clamp" the breakdown voltage of the MOSFET active area 108 is 32V. The skilled person will appreciate that the values are non-limiting and merely illustrative and that specific values may be chosen in accordance with the principles described in the present disclosure.

Taking plot "O 25V clamp" as an example, the breakdown voltage of the clamping diode 102 is 25V and during operation from 0V up to 25V, VDS, no reverse current, IDS, will flow. When VDS reaches the breakdown voltage of the clamping diode 102, in this case 25V, the clamping diode 102 begins to avalanche and the MOSFET semiconductor device 100 is clamped to the breakdown voltage of the integrated clamping diode 102 which is lower than the breakdown voltage of the MOSFET active area 108. When the clamping diode 102 operates in avalanche, an increase in diode current IDS causes VDS to increase the until VDS reaches the breakdown voltage of the MOSFET active area, 32V, which corresponds to an IDS of approximately 1.5 A (this is the current, Imax, at which the MOSFET active area 108 starts to share avalanche current) and the MOSFET active area 108 begins to avalanche and share current with the clamping diode 102. In this way, when the reverse current IDS does not exceed the maximum current rating of the clamping diode 102 Imax, the clamping diode 102 protects the MOSFET active area 108. Furthermore, Imax, may also be designed to be higher than the avalanche current expected during normal operation. Thus, ensuring no avalanche damage to the MOSFET active area 108.

Similarly, the above discussion is also true for plot "H 28.5V clamp", except that the breakdown voltage of the clamping diode 102 is 28.5V and Imax is approximately 0.5 A. The difference in IMAX between "O 25V clamp" and "H 28.5V clamp" is due to, clamping diode 102 avalanche current and the series resistance of the of the clamping diode 102.

Specifically, because the breakdown voltage for the "O 25V clamp" is lower than the breakdown voltage for the "H 28.5V clamp", avalanche will occur earlier for the "O 25V clamp" such that when the current IDS reaches a current that corresponds to the breakdown voltage of the MOSFET Active area (32 volts in both examples) the current Imax will consequently be higher for the clamp diode 102 with the lower breakdown voltage.

In addition, plot "O 25V clamp" is shifted higher than plot "H 28.5V clamp" due to the resistance of the clamping diode 102 and the MOSFET active area 108. This is further illustrated from a comparison of the plot "X control" which does not include a clamping diode 102 and therefore has no clamping resistance component. In the case where the clamping diode 102 did not include a clamping resistance this would result in the MOSFET active area 108 breakdown voltage being higher than the breakdown voltage of the diode for all currents. The consequence of this is that the clamping diode 102 would take all of the avalanche current and therefore potentially damage the clamping diode 102.

Therefore, by appropriate setting of clamping resistance 104 both the breakdown voltage and the current rating of the clamping diode 102 Imax can be chosen without compromising the Rds(on) for a fixed contact window 236 area. Increased contact window 236 area results in reduced series resistance of the clamping diode 102 and therefore higher current handling capability Imax of the clamping diode 102. The current handling capability of clamping diode 102 the will start to saturate when the contact window 236 area is decreased and there is a minimum contact window 236 area, below which the clamp diode 102 will fail to work. If the clamping resistance 104 is too low, due to for example the close spacing between contacts 232 in a contact window 236, the MOSFET active area 108 will never switch on and will always be clamped at the lower clamping diode 102 voltage. Likewise, if the clamping resistance 104 is too high due to for example a too wide spacing between the contacts 232 in a contact window 236 area the MOSFET active area 108 will not be protected.

For a fixed contact window area, the clamping resistance 104, Rs, of the clamping diode 102 may be given by the following equation:

$$R_s = \frac{V_{BR(MOS)} - V_{BR(Clamp\ Diode)}}{I_{Max}} \qquad \text{Eqn. 1}$$

Where:

$I_{max}$ is the maximum current allowable current for clamp diode before MOSFET active area 108 will start to avalanche;

$V_{BR(MOS)}$ is the breakdown voltage of the active area of the MOSFET; and $V_{BR(Clamping\ Diode)}$ is the breakdown voltage of the clamping diode.

From Eqn. 1 it can be seen that the clamping resistance 104, Rs, of the clamping diode 102 depends on the current Imax at which the MOSFET starts to avalanche and the difference between the breakdown voltage of the MOSFET, VBR(MOS), and the breakdown voltage of the clamp diode, VBR(Clamp Diode).

Table 1, below, shows example clamping diode resistance Rs 104, values and maximum current allowable currents for clamping diodes 102 at typical MOSFET and clamp diode breakdown voltages.

TABLE 1

| $I_{max}$ | $V_{BR(MOS)}$ | $V_{BR(Clamp\ Diode)}$ | $R_s$ |
|---|---|---|---|
| 0.1 A | 30 V | 24 V | 60Ω |
| 1 A | 30 V | 24 V | 6Ω |
| 5 A | 30 V | 24 V | 1.2Ω |
| 5 A | 30 V | 27 V | 0.6Ω |
| 5 A | 60 V | 55 V | 1Ω |
| 2 A | 100 V | 90 V | 5Ω |

Figure 5:
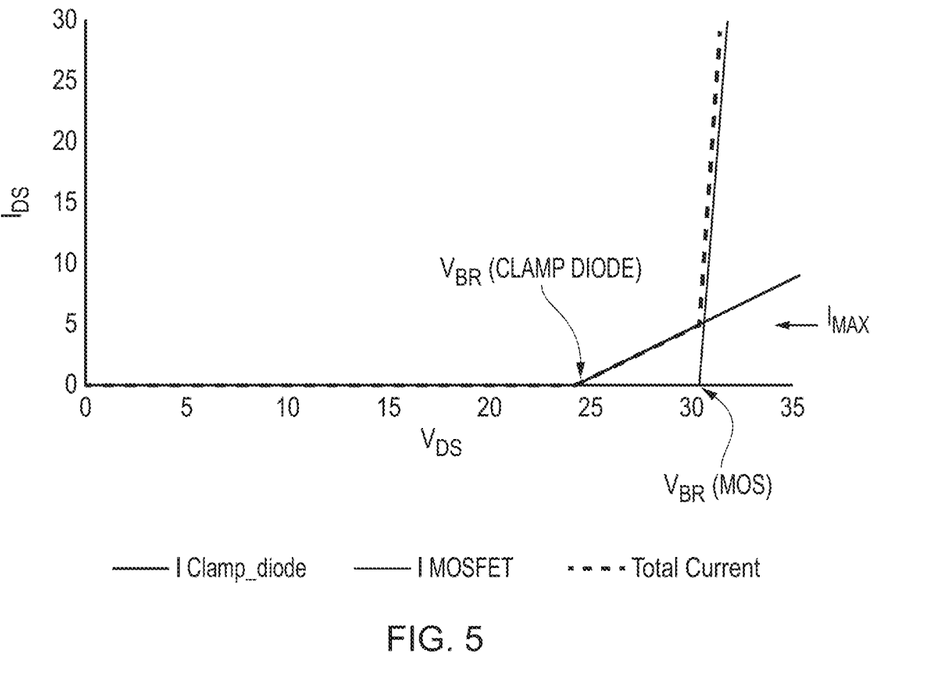
FIG. 5 illustrates the reverse IDS current versus reverse VDS voltage behavior showing the total current, together with the clamping diode current and the MOSFET active area current.

As can be seen, where Imax is fixed, the smaller the difference between the breakdown voltage of the MOSFET, VBR(MOS), and the breakdown voltage of the clamp diode, VBR(Clamp Diode) the smaller the required series resistance. For example, and as illustrated in FIG. 5, for a clamping diode 102 having a breakdown voltage of 24V, having an Imax of 5 A and an active area breakdown voltage of 30V, a 1.2Ω (ohm) clamping diode resistance Rs will be required to ensure all current below 5 A is taken by the clamping 102 diode, and above an Imax of 5 A, the current is shared with the MOSFET active area 108 such that all current above 5 A is taken by the active area. FIG. 5, follows the same relationship as the plots of FIG. 4.

It is therefore possible to select the specific resistance value of the clamping diode 102, as discussed above in relation to FIG. 3, based on the breakdown voltages of the clamping diode 102 and the MOSFET active area 108, and the Imax of the clamping diode 102. Following the discussion of FIG. 3, and taking an extreme example, if no conductive material is arranged in contact windows 236, that is a zero-contact area to contact window, then the total area of the contacts 232 will be zero and the anode of the clamping diode 102 will not be formed. Likewise, if the total area of the contacts 232 is 100% of the area of the contact windows then the MOSFET active will never avalanche. For example, the total area of the contacts 232 as a percentage of the contact window area is approximately 0.1%. However, the skilled person will appreciate that for different breakdown voltages the area may be higher and up to 99.9%.

The clamping diode 102 prevents the MOSFET active area 108 from avalanching because as VDS is increased to the breakdown voltage of the clamping diode 102, VBR (Clamp Diode), which is lower than the breakdown voltage of the MOSFET active area 108, VBR(MOS), the clamping diode 102 will begin to avalanche first and the MOSFET active area 108 will be clamped to the breakdown voltage of the clamping diode 102. Due to the behaviour of the clamping diode 102, where the breakdown voltage VBR (Clamp Diode) increases with reverse IDS, and also with the temperature of the clamping diode 102 as it undergoes avalanche, such that the breakdown voltage VBR(Clamp Diode) increases to the breakdown voltage of the MOSFET active area 108, VBR(MOS), the MOSFET active area 108 thus share the current and the breakdown voltage of the MOSFET semiconductor device 100 will be the breakdown voltage of the MOSFET active area 108, VBR(MOS). In this way the clamping diode 102 alone handles relatively low-level repetitive avalanche events (that is up to the rated breakdown voltage of the clamping diode 102), whereas the clamping diode 102 and the MOSFET active area 108 combined handle relatively high level avalanche events (that is greater than the rated breakdown voltage of the clamping diode 102).

Consequently, where the MOSFET semiconductor device 100 according to embodiments undergoes multiple repetitive switching events and thus undergoes repetitive relatively low level avalanche events, device parameters such as Rds(on) will not vary due to the clamping diode 102 connected between source 112 and the drain 116 of the MOSFET active area 108. Furthermore, during switching events the MOSFET semiconductor device 100 with the integrated clamp diode 102 is capable of preventing the MOSFET active area 108 from avalanching up to a current Imax, and should the current exceed Imax reduce the time the MOSFET active area 108 spends in avalanche. Furthermore, switching losses may be reduced by removing drain oscillations.

Figure 6A:
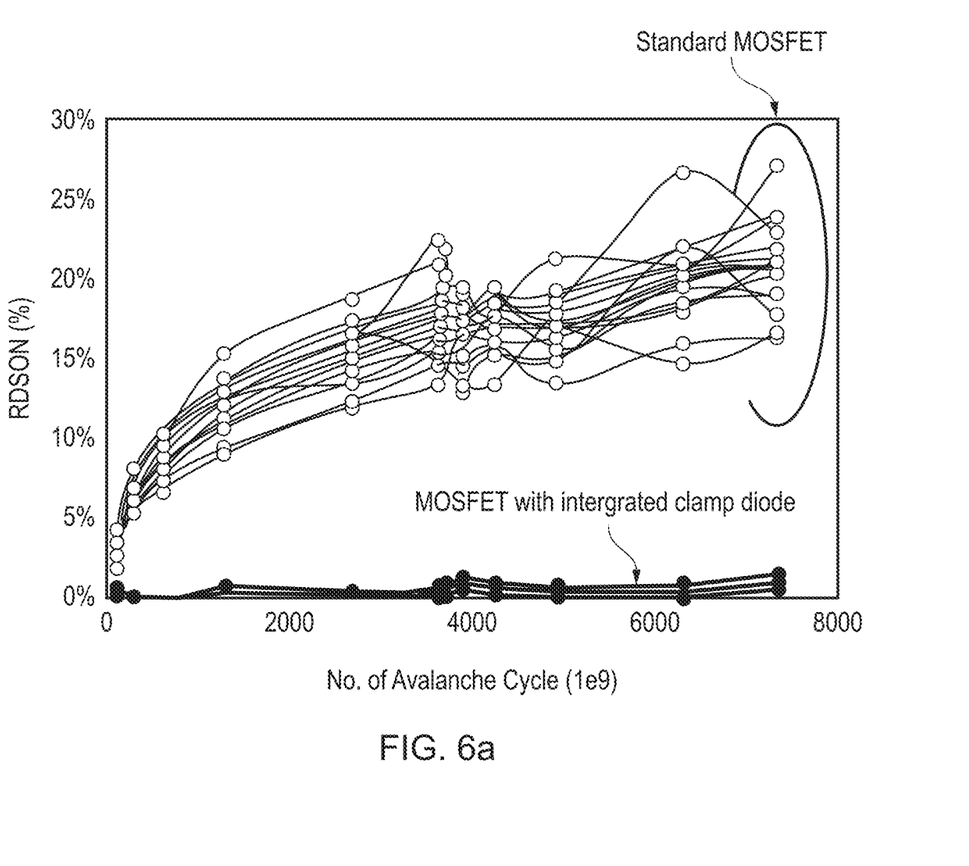
FIG. 6a illustrates a graph of Rds(on) verses number of avalanche cycles for a known standard MOSFET and a MOSFET semiconductor device according to embodiments.

One advantage of the MOSFET semiconductor device 100 according to embodiments is illustrated in FIG. 6a, which shows the effect of Rds(on) of a known standard MOSFET device as the number of avalanche cycles increases for a gate source voltage (VGS) of 10V. FIG. 6a also shows the effect of Rds(on) of the MOSFET semiconductor device 100 of the present disclosure. When compared to the MOSFET semiconductor device 100 of the present application the standard MOSFET can undergo an increase of over 25% in Rds(on) at 7000×10⁹ avalanche cycles, whereas the Rds(on) increase for the MOSFET semiconductor device 100 is substantially lower at approximately 1%.

Figure 6B:
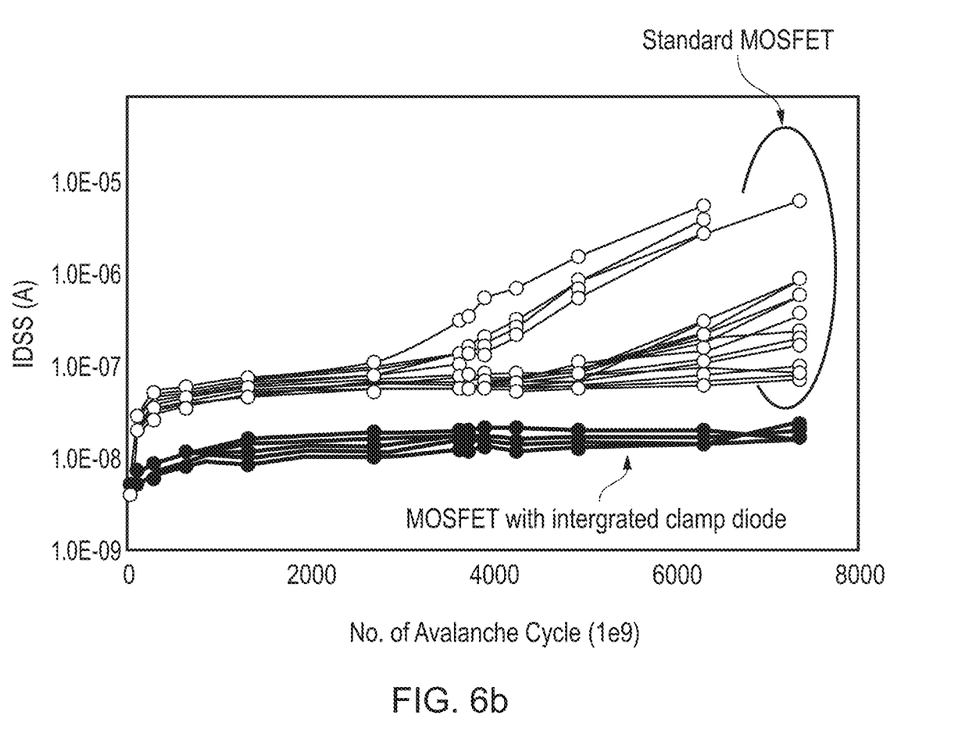
FIG. 6b illustrates a graph of IDSS leakage current verses number of avalanche cycles for a known standard MOSFET and a MOSFET semiconductor device according to embodiments.

Likewise, FIG. 6b shows the effect of IDSS leakage degradation (at a drain source voltage of 24V) with increased number of avalanche cycles for both a standard MOSFET and a MOSFET semiconductor device 100 according to embodiments. For the MOSFET semiconductor device 100, at 7000×10⁹ avalanche cycles, there is very little increase in leakage current, whereas the standard MOSFET shows an increase of over 1 mA.

Whilst the foregoing discussion relates to an n-channel MOSFET semiconductor device 100, the described embodiments are not limited to n-channel devices. The skilled person will appreciate that the arrangements of the present disclosure are equally applicable to p-channel MOSFET semiconductor devices. For example, the MOSFET semiconductor device 100 may comprise an p-type substrate 210, a p-type epitaxial silicon layer 212 and an n-type body layer 214.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A semiconductor device, comprising:
   a MOSFET integrated with a p-n junction, wherein the p-n junction is arranged as a clamping diode that provides a clamping resistance across a source contact and a drain contact of the MOSFET, the p-n junction including a contact terminal formed by at least one shallow conductive trench that is configured to modify the clamping resistance;
   wherein the MOSFET defines a first breakdown voltage and the clamping diode defines a second breakdown voltage;
   wherein the first breakdown voltage is greater than the second breakdown voltage so that the clamp diode is configured and arranged receive a low avalanche current;
   wherein the MOSFET is configured and arranged to receive a high avalanche current.

2. The semiconductor device of claim 1, wherein the MOSFET including a plurality of the conductive shallow trenches and the clamping resistance is modified by including a plurality of the shallow conductive trenches.

3. The semiconductor device of claim 1, wherein the MOSFET further comprises:
   a semiconductor substrate;

an epitaxial layer formed on the semiconductor substrate;
a body layer formed on the epitaxial layer; and
a plurality of spaced apart deep conductive trenches extending through the body layer and the epitaxial layer and extending into the semiconductor substrate;
wherein the semiconductor substrate and the epitaxial layer are formed of a first conductivity type, and wherein the body layer is formed of a second conductivity type opposite to the first conductivity type.

4. The semiconductor device of claim 3, wherein the spaced apart deep conductive trenches define a contact window of the body layer; and wherein the contact window is connected to at least one shallow conductive trench forming a first contact terminal of the p-n junction.

5. The semiconductor device of claim 3, wherein the p-n junction provides a clamping resistance across the source contact and the drain contact of the MOSFET.

6. The semiconductor device of claim 4, wherein the at least one shallow conductive trench has a total area that comprises between 0.1% and 99.9% of the contact window area.

7. The semiconductor device of claim 4, wherein the p-n junction provides a clamping resistance across the source contact and the drain contact of the MOSFET.

8. The semiconductor device of claim 7, wherein the clamping resistance is modified by modifying an area of the contact window.

9. The semiconductor device of claim 5, wherein the clamping resistance is modified by varying a density per unit area of a plurality of the shallow conductive trenches.

10. The semiconductor device of claim 9, wherein the plurality shallow conductive trenches has a total area that comprises between 0.1% and 99.9% of the contact window area.

11. The semiconductor device of claim 1, wherein the clamping diode is arranged to avalanche before the MOSFET.

12. The semiconductor device of claim 1, wherein the clamping diode is configured and arranged to operate at avalanche events up to a breakdown voltage of an active region of the MOSFET, and wherein the clamping diode and MOSFET are arranged to operate at avalanche events over the breakdown voltage of the active region of the MOSFET.

13. A method of manufacturing a semiconductor device, comprising:
forming a MOSFET integrated with a p-n junction, the p-n junction arranged as a clamping diode that provides a clamping resistance across a source contact and a drain contact of the MOSFET, the p-n junction including a contact terminal formed by at least one shallow conductive trench that is configured to modify the clamping resistance;
wherein a MOSFET active region defines a first breakdown voltage and the clamping diode defines a second breakdown voltage, wherein the second breakdown voltage is lower than the first breakdown voltage such that the clamp diode is configured and arranged receive a low avalanche current and the MOSFET is configured and arranged to receive a high avalanche current.

14. The method of claim 13, further comprising the steps of:
providing a semiconductor substrate;
forming an epitaxial layer on the semiconductor substrate; and forming a body layer on the epitaxial layer; and
forming a plurality of spaced apart deep conductive trenches extending through the body layer and the epitaxial layer and extending into the semiconductor substrate;
wherein the semiconductor substrate and the epitaxial layer are formed of a first conductivity type, and wherein and the body layer is formed of a second conductivity type opposite to the first conductivity type.

15. The method of claim 14, further comprising the steps of:
defining a contact window of the body layer between the spaced apart deep conductive trenches; and
connecting the contact window to the at least one shallow conductive trench to form a first contact terminal of the p-n junction.

* * * * *